United States Patent
Itabashi et al.

(10) Patent No.: US 11,437,962 B2
(45) Date of Patent: Sep. 6, 2022

(54) DIFFERENTIAL AMPLIFIER CIRCUIT HAVING VARIABLE GAIN

(71) Applicant: SUMITOMO ELECTRIC INDUSTRIES, LTD., Osaka (JP)

(72) Inventors: Naoki Itabashi, Osaka (JP); Keiji Tanaka, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/077,835

(22) Filed: Oct. 22, 2020

(65) Prior Publication Data

US 2021/0126604 A1 Apr. 29, 2021

(30) Foreign Application Priority Data

Oct. 24, 2019 (JP) .............................. JP2019-193433

(51) Int. Cl.
*H03F 3/45* (2006.01)

(52) U.S. Cl.
CPC .................. *H03F 3/45183* (2013.01); *H03F 2203/45022* (2013.01); *H03F 2203/45026* (2013.01)

(58) Field of Classification Search
CPC ....... H03F 3/45183; H03F 2203/45022; H03F 2203/45026; H03F 2200/451; H03F 3/19; H03F 2203/45491; H03F 2203/45492; H03F 2203/45674; H03F 2203/45702; H03F 3/45098; H03G 5/28; H03G 1/0035
USPC ....................................................... 330/254
See application file for complete search history.

(56) References Cited

U.S. PATENT DOCUMENTS

| 7,084,704 B2* | 8/2006 | Sowlati ............... H03F 3/45098 330/253 |
| 2003/0098744 A1 | 5/2003 | Banba |
| 2004/0178850 A1 | 9/2004 | Banba |
| 2004/0183599 A1 | 9/2004 | Banba |
| 2005/0179494 A1 | 8/2005 | Banba |

FOREIGN PATENT DOCUMENTS

| JP | S58-204614 | 11/1983 |
| JP | S63-175510 | 7/1988 |
| JP | H11-509711 | 8/1999 |

(Continued)

*Primary Examiner* — Khanh V Nguyen
*Assistant Examiner* — Khiem D Nguyen
(74) *Attorney, Agent, or Firm* — Smith, Gambrell & Russell, LLP.

(57) ABSTRACT

A differential amplifier circuit includes a first transistor, a second transistor, a field effect transistor (FET) connected between the first transistor and the second transistor, a first current source connected to the first transistor, a second current source connected to the second transistor, and a control circuit. The first transistor and the second transistor generate a differential output signal in accordance with an input signal and a reference signal. The control circuit includes a first resistor and a second resistor connected in series between the drain and the source of the FET, a center node between the first resistor and the second resistor, a third resistor connected between the gate of the FET and the center node, and a variable current source. The variable current source supplies a control current to the third resistor in accordance with a gain control signal. The control circuit controls on-resistance of the FET.

11 Claims, 8 Drawing Sheets

(56) References Cited

FOREIGN PATENT DOCUMENTS

| | | |
|---|---|---|
| JP | 2003-168937 | 6/2003 |
| JP | 2003-168938 | 6/2003 |
| JP | 2003-243951 | 8/2003 |
| JP | 2004-304775 | 10/2004 |
| JP | 2011-205470 | 10/2011 |
| WO | 97-42704 | 11/1987 |

\* cited by examiner

DIFFERENTIAL AMPLIFIER CIRCUIT HAVING VARIABLE GAIN

CROSS-REFERENCE TO RELATED APPLICATIONS

The present application claims priority based on Japanese Patent Application No. 2019-193433, which is filed on Oct. 24, 2019, the entire content disclosed in the aforementioned Japanese patent applications being incorporated herein by reference.

TECHNICAL FIELD

The present disclosure relates to a differential amplifier circuit having a variable gain.

BACKGROUND

Japanese Patent Laid-Open No. 2004-304775 discloses a variable gain differential amplifier. In the variable gain differential amplifier, each collector of paired transistors is connected to a power supply terminal through a resistor, and each emitter of the paired transistors is connected to a ground terminal through a resistor. A series circuit constituted by two shunt resistors and a FET sandwiched by the two shunt resistors is between the respective emitters of the paired transistors. The gate of the FET is connected to the control terminal through a resistor. The series circuit is provided as a variable resistance circuit.

The variable gain differential amplifier generates a pair of complimentary output signals (differential output signal) in accordance with a pair of complimentary input signals (differential input signal). The amplification factor (gain) of the differential output signal relative to the differential input signal can be adjusted in response to the gain adjustment signal. In such a variable gain differential amplifier, the linearity of the differential output signal with respect to the differential input signal may be required. However, when only one of the complimentary input signals and a reference signal of a constant voltage instead of the other of the complimentary input signals are provided to the variable gain differential amplifier, an asymmetrical circuit operation thereof may deteriorate the linearity than when both the complimentary input signals are provided.

SUMMARY

The present disclosure provides a differential amplifier circuit. The differential amplifier circuit includes a first transistor, a second transistor, a field effect transistor (FET), a first current source, a second current source, and a control circuit. The first transistor has a first control terminal, a first inflow terminal, and a first outflow terminal. The first control terminal receives an input signal. The first inflow terminal outputs a first output signal. The second transistor has a second control terminal, a second inflow terminal, and a second outflow terminal. The second control terminal receives a reference signal. The second inflow terminal outputs a second output signal. The FET has a gate, a drain, and a source. The drain is electrically connected to the first outflow terminal, and the source is electrically connected to the second outflow terminal. The first current source is electrically connected to the first outflow terminal, and the second current source is electrically connected to the second outflow terminal. The control circuit includes a first resistor, a second resistor, a center node, a third resistor, and a variable current source. The first resistor has a first end and a second end. The first end is electrically connected to the drain of the FET. The second resistor has a third end and a fourth end. The third end is electrically connected to the source of the FET. The center node is electrically connected to the second end of the first resistor and the fourth end of the second resistor. The third resistor is electrically connected between the gate of the FET and the center node. The variable current source is configured to supply a control current to the third resistor in accordance with a gain control signal. The first resistor has a resistance value equal to a resistance value of the second resistor.

DETAILED DESCRIPTION

Hereinafter, various exemplary embodiments will be described in detail with reference to the drawings. The present disclosure is not limited to these exemplifications. It is intended that the present invention is defined by the claims and includes all changes within the meaning and range equivalent to the claims. In the drawings, the same or corresponding parts shall be denoted by the same reference numerals.

Figure 1:
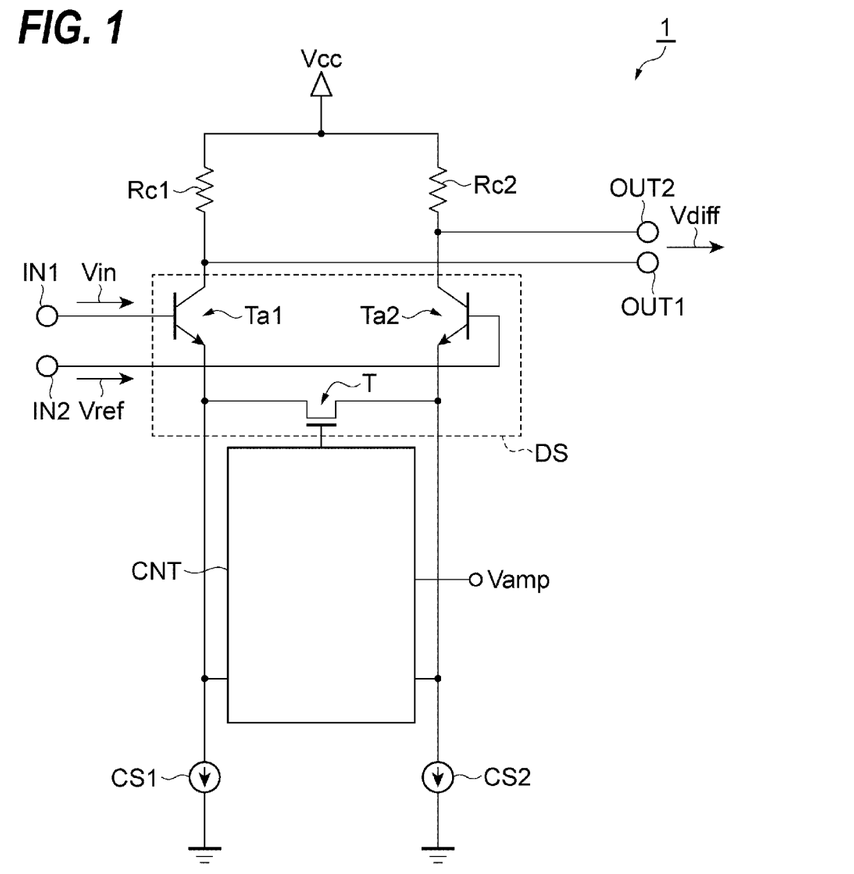
FIG. 1 is a diagram showing a configuration of a differential amplifier circuit according to one exemplary embodiment.

Referring to FIG. 1, a configuration of a differential amplifier circuit 1 according to one exemplary embodiment is described. The differential amplifier circuit 1 includes a pair of input terminals IN1, IN2, a pair of output terminals OUT1, OUT2, a differential circuit DS, a current source CS1 (first current source) and a current source CS2 (second current source), a resistor Rc1 and a resistor Rc2, and a control circuit CNT. The differential circuit DS includes a pair of transistors Ta1 (first transistor), Ta2 (second transistor) and a field-effect transistor (FET)T.

The base of the transistor Ta1 (first control terminal) is electrically connected to the input terminal IN1. The base of the transistor Ta2 (second control terminal) is electrically connected to the input terminal IN2. In one embodiment, for example, a single input signal Vin (input signal) is input to the base of the transistor Ta1 through the input terminal IN1, and a reference voltage Vref (reference signal) set to a constant voltage value is input to the base of the transistor Ta2 through the input terminal IN2.

The collector of the transistor Ta1 (first inflow terminal) is electrically connected to a power supply Vcc through the resistor Rc1. The collector of the transistor Ta2 (second inflow terminal) is electrically connected to the power supply Vcc through a resistor Rc2. The power supply Vcc supplies the transistor Ta1 and transistor Ta2 with a supply voltage required for transistor operation thereof (e.g., emitter-collector voltage). The collectors of the transistors Ta1 and Ta2 may be electrically connected the power supply Vcc through a power line.

The collector of the transistor Ta1 (first inflow terminal) is electrically connected to the output terminal OUT1. The collector of the transistor Ta2 (second inflow terminal) is electrically connected to the output terminal OUT2. From the collectors of the transistors Ta1, Ta2, a differential output signal Vdiff is output in response to the input signal Vin. More specifically, the collector of the transistor Ta1 outputs one of paired output signals (first output signal), and the collector of the transistor Ta2 outputs the other of the paired output signals (second output signal). The paired output signals are complimentary and constitutes the differential output signal Vdiff. For example, one of the paired output signals (first output signal) may be a negative-phase component of the differential output signal Vdiff, and the other of the paired output signal (second output signal) may be a positive-phase component of the differential output signal Vdiff. Voltage of the differential output signal Vdiff is equal to the difference between the voltage at the output terminal OUT1 and the voltage at the output terminal OUT2, for example. The transistors Ta1 and Ta2 preferably have the same electrical properties as a pair of transistors. The input signal Vin is a signal input to either the base of the transistor Ta1 or the base of the transistor Ta2. FIG. 1 illustrates an exemplary case where the input signal Vin is input to the base of the transistor Ta1. The differential output signal Vdiff is a differential signal output from the collector of the transistor Ta1 and the collector of the transistor Ta2. For example, the collector of the transistor Ta1 outputs the negative phase component of differential output signal Vdiff (first output signal), and the collector of the transistor Ta2 outputs the positive phase component of differential output signal Vdiff (second output signal). The positive phase component of differential output signal Vdiff has a phase opposite to a phase of the negative phase component of differential output signal Vdiff.

The drain of the transistor T (second terminal) is electrically connected to, for example, the emitter of the transistor Ta1 (first outflow terminal). In that case, the source (first terminal) of the transistor T is electrically connected to the emitter of the transistor Ta2 (second outflow terminal). The drain and the source of the transistor T may be replaced each other.

In contrast, the source of the transistor T is electrically connected to the emitter of the transistor Ta1 (first outflow terminal), the drain of the transistor T may be electrically connected to the emitter of the transistor Ta2 (second outflow terminal). The transistor T, since it is used as a variable resistor, it is preferable that the electrical characteristics do not change even when replacing the drain and source each other. For example, in the structure of the transistor T, it is preferable that the shape of the drain and the source around the gate is symmetrical with respect to the gate sandwiched by the drain and the source. If the transistor T does not have such a symmetrical structure with respect to the gate thereof, a pair of asymmetrical transistors T1, T2 may be used instead of the transistor T, where the drain of the asymmetrical transistor T1 is connected to the source of the asymmetrical transistor T2 and the source of the asymmetrical transistor T1 is connected to the drain of the asymmetrical transistor T2.

The control circuit CNT is electrically connected to the gate of the transistor T (center terminal). The control circuit CNT is electrically connected to the drain and the source of the transistor T. The control circuit CNT applies a resistance control voltage (resistance control signal) to the gate of the transistor T. An intermediate potential between the potential of the drain and the potential of the source of the transistor T is set to a reference potential of the resistance control voltage.

The control circuit CNT receives a gain control voltage Vamp (gain control signal). The gain control signal Vamp is, for example, a voltage signal which is adjusted according to amplitude of the differential output signal Vdiff, or according to amplitude of the input signal Vin. The control circuit CNT adjusts the resistance control voltage applied to the gate of the transistor T in accordance with magnitude of the gain control signal Vamp. The control circuit CNT controls the resistance value between the drain and the source of the transistor T by varying the resistance control voltage. When the resistance control voltage is larger than a predetermined voltage value (e.g., the threshold voltage of the transistor T), an increase of the resistance control voltage decreases the resistance between the source and drain of the transistor T (on-resistance), and a decrease of the resistance control voltage increases the resistance between the source and drain of the transistor T (on-resistance). The gain of the differential amplifier circuit 1 can be varied by adjusting the on-resistance of the transistor T. In the control circuit CNT, a reference potential of the resistance control voltage applied to the gate of the transistor T is set to an average value of the potential at the drain (drain potential) and the potential at the source (source potential) of the transistor T, or a center potential between the drain potential and the source potential.

When the input signal changes, the drain potential and the source potential change in response to the input signal. The resistance control voltage can be stabilized by setting the reference potential of the resistance control voltage to a center potential between the drain potential and the source potential. The drain potential increases, when the source potential decreases, and the drain potential decreases, when the source potential increases. Therefore, the center potential between the drain potential and the source potential has variation smaller than variation of the drain potential and the source potential. The gain of the differential amplifier circuit 1 may be unstable, when the variation of the resistance control voltage causes fluctuation of the on-resistance of the transistor T. The resistance control voltage is preferably kept constant to a value set by the gain control signal Vamp.

The current source CS1 is electrically connected to the emitter of the transistor Ta1. The current source CS2 is electrically connected to the emitter of the transistor Ta2. The current source CS1 supplies a constant current (first current), and the current source CS2 supplies a constant current (second current). For example, the first current flows to ground through the current source CS1 from a node connecting the emitter of the transistor Ta1 and the drain of the transistor T, and the second current flows to ground through the current source CS2 from a node connecting the emitter of the transistor Ta2 and the source of the transistor T. The first current may be set to a current value equal to a current value of the second current. A sum of the emitter current of the transistor Ta1 and the emitter current of the transistor Ta2 becomes equal to a sum of a current value of the first current and a current value of the second current.

The transistor Ta1 and transistor Ta2 can be, for example, NPN-type bipolar transistors. The transistor T can be, for example, a field effect transistor (FET). More specifically, the transistor T can be a Metal-Oxide-Semiconductor FET (MOSFET).

Thus, in the differential amplifier circuit 1, the resistance control voltage is varied in accordance with the gain control signal Vamp. Increase and decrease of the resistance control voltage varies the drain-source resistance (on-resistance) of the transistor T connected between the respective emitters of the transistor Ta1 and the transistor Ta2. Therefore, providing the gain control signal to the differential amplifier circuit 1 allows the gain to be varied in accordance with amplitude of the input signal Vin or amplitude of the differential output signal Vdiff. Further, in the differential amplifier circuit 1, the reference potential of the resistance control voltage applied to the gate of the transistor T can be generated so as to be an average value of the drain potential and the source potential. In this case, although voltage change of a single input signal Vin changes the drain potential and the source potential of the transistor T, the amplitude of the voltage between the gate and the drain (gate-source voltage) of the transistor T can be equal to the amplitude of the voltage between the gate and the source (gate-drain voltage) of the transistor T. Such condition can reduce distortion of the differential output signal Vdiff with respect to the input signal Vin. The resistance control voltage applied to the gate of the transistor T is kept at a constant voltage with respect to the reference potential of the resistance control voltage. Therefore, the on-resistance of the transistor T is stabilized at an adjusted value, even if voltage of the input signal Vin changes at a high frequency. Incidentally, the reference potential of the gate control voltage fluctuates up and down with time, because the drain potential and the source potential of the transistor T changes in accordance with voltage change of the input signal Vin. Assuming that ground potential is set to the reference potential of the resistance control voltage, the resistance control voltage applied to the gate of the transistor T also fluctuates up and down with time in accordance with the voltage change of the input signal Vin. Therefore, although the gate potential applied to the gate of the transistor T fluctuates up and down with respect to the ground potential as well as the reference potential of the resistance control voltage fluctuates up and down, the difference between the gate potential and the reference potential of the resistance control voltage is kept constant. The difference between the gate potential and the reference potential of the resistance control voltage corresponds to the resistance control voltage.

Figure 2:
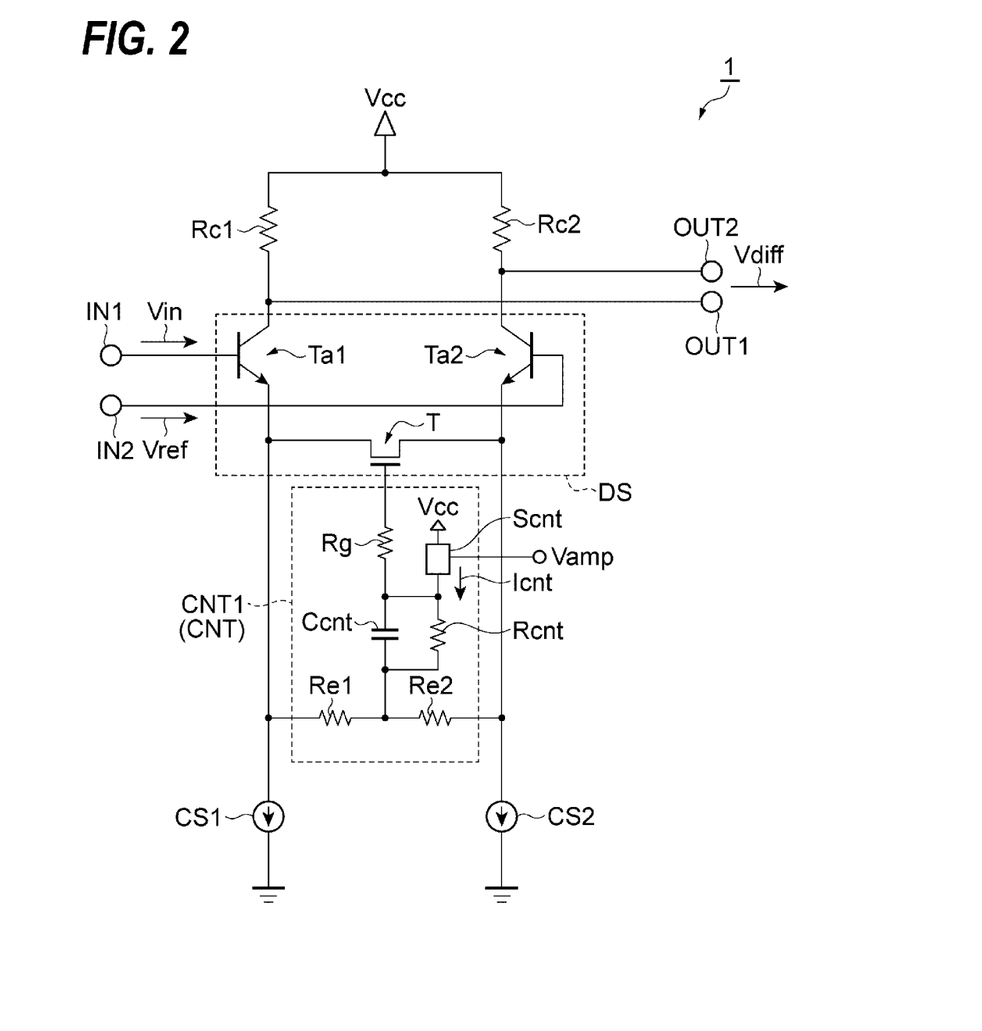
FIG. 2 is a diagram illustrating a specific configuration of the differential amplifier circuit shown in FIG. 1.
Figure 3:
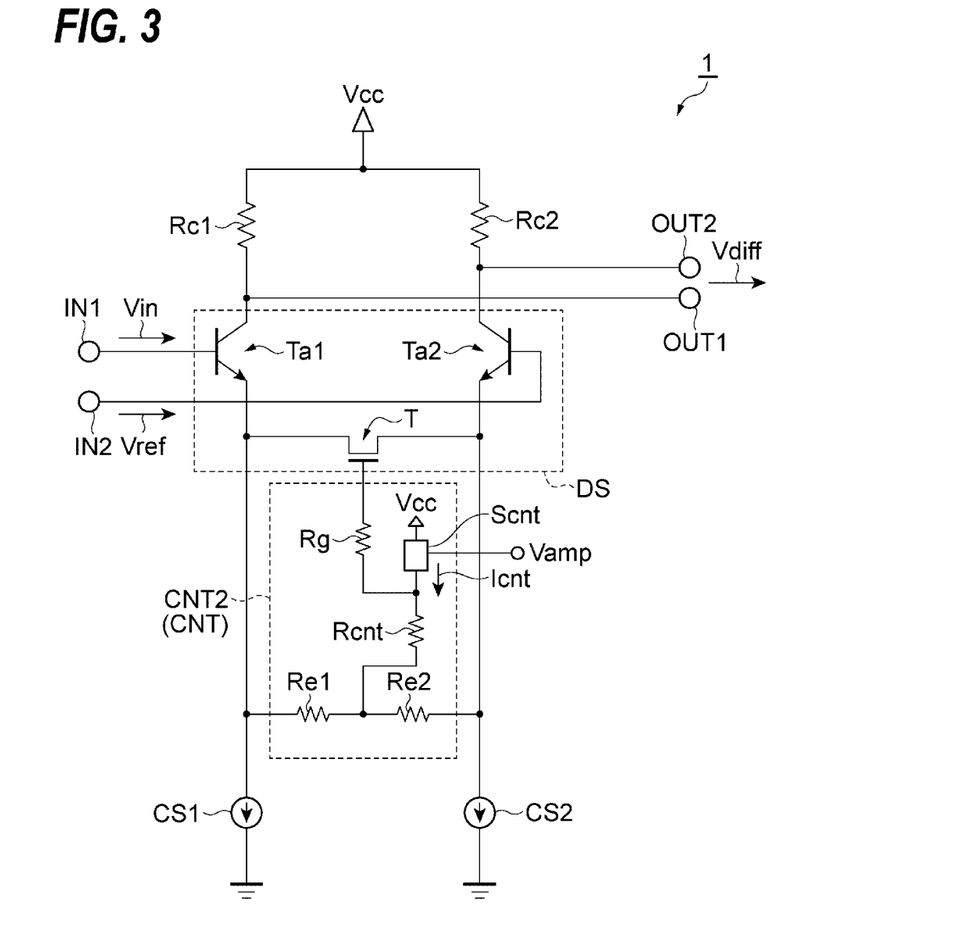
FIG. 3 is a diagram illustrating a specific configuration of the differential amplifier circuit shown in FIG. 1.
Figure 4:
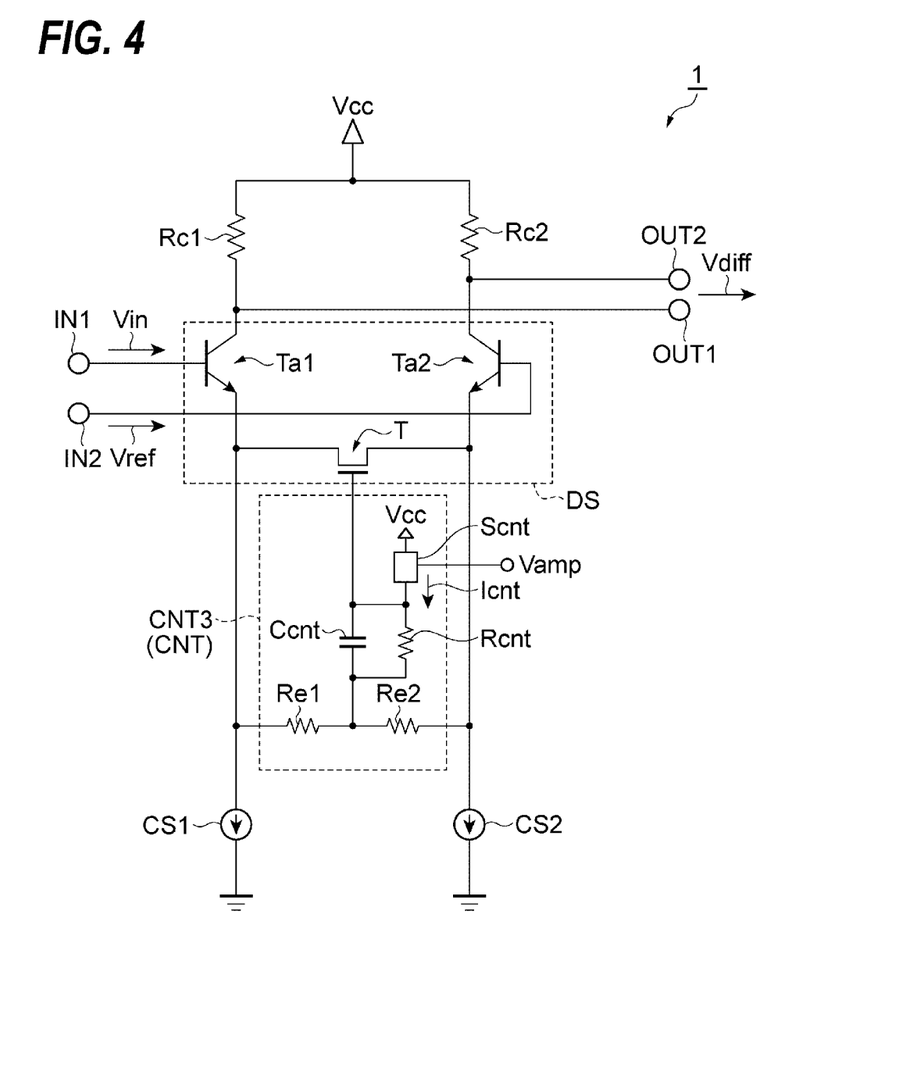
FIG. 4 is a diagram illustrating a specific configuration of the differential amplifier circuit shown in FIG. 1.
Figure 5:
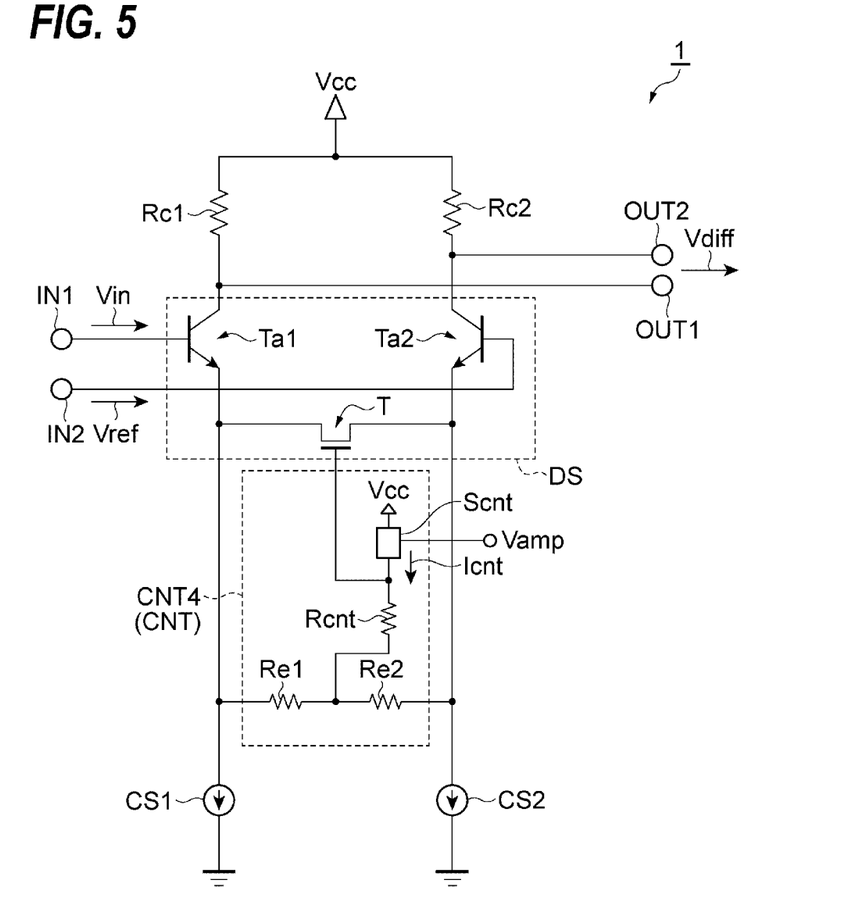
FIG. 5 is a diagram illustrating a specific configuration of the differential amplifier circuit shown in FIG. 1.
Figure 6:
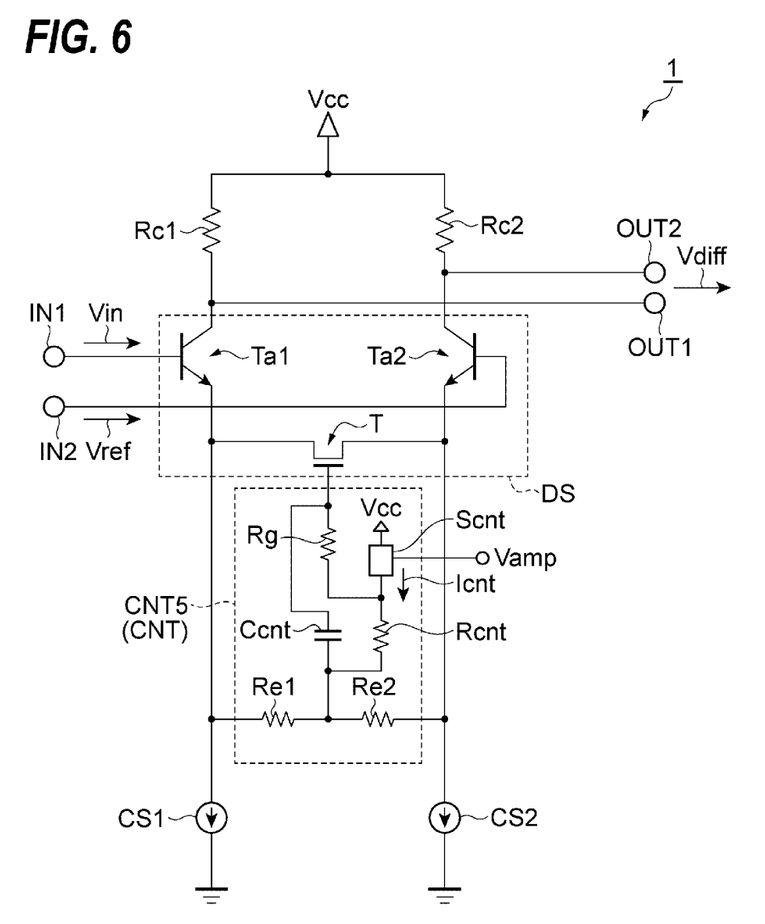
FIG. 6 is a diagram illustrating a specific configuration of the differential amplifier circuit shown in FIG. 1.

The control circuit CNT shown in FIG. 1 can be, for example, any of the control circuit CNT1 shown in FIG. 2, the control circuit CNT2 shown in FIG. 3, the control circuit CNT3 shown in FIG. 4, the control circuit CNT4 shown in FIG. 5, and the control circuit CNT5 shown in FIG. 6.

First, the configuration of the control circuit CNT1 shown in FIG. 2 is described. The control circuit CNT1 includes a resistor Re1 (first resistor), a resistor Re2 (second resistor), a resistor Rcnt (third resistor), and a resistor Rg (fourth resistor). The control circuit CNT1 further includes a capacitor Ccnt and a variable current source Scnt.

The resistor Re1 and the resistor Re2 are electrically connected in series with each other between the drain and the source of the transistor T. For example, one end of the resistor Re1 (first end) is electrically connected to the drain of the transistor T, and one end of the resistor Re2 (third end) is electrically connected to the source of the transistor T. The other end of the resistor Re1 (second end) is electrically connected to the other end of the resistor Re2 (fourth end). The resistor Re1 may have a resistance value equal to a resistance value of the resistor Re2. The node between the resistor Re1 and the resistor Re2 (center node) generates the reference potential of the resistance control voltage.

The resistor Rcnt and the capacitor Ccnt are electrically connected in parallel to each other, between the center node and the variable current source Scnt, further, between the center node and the gate of the transistor T. The resistor Rg is electrically connected between the gate of the transistor T and a connection node of the variable current source Scnt, the resistor Rcnt, and the capacitor Ccnt. The variable current source Scnt receives the gain control signal Vamp, and supplies a control current Icnt to the resistor Rcnt in accordance with the gain control signal Vamp. The resistance control voltage is generated by the voltage drop of the resistor Rcnt through which the control current Icnt flows. The resistance control voltage is applied to the gate of the transistor T through the resistor Rg with reference to the reference potential thereof generated at the center node. For example, since the transistor T is a MOSFET and the gate of the transistor T has large input impedance, a DC current hardly flows into the gate of the transistor T. Accordingly, no DC current flows though the resistor Rg and no voltage drop is generated at the resistor Rg. Therefore, the resistance control voltage generated by the resistor Rcnt is applied to the gate of the transistor T as it is.

Next, the configuration of the control circuit CNT2 shown in FIG. 3 is described. The control circuit CNT2 differs from the control circuit CNT1 shown in FIG. 2 in that the capacitor Ccnt of the control circuit CNT1 is removed. The control circuit CNT2 includes the resistor Re1, the resistor Re2, the resistor Rcnt, and the resistor Rg, and the variable current source Scnt.

The resistor Re1 and the resistor Re2 are electrically connected in series with each other between the drain and the source of the transistor T. For example, one end of the resistor Re1 (first end) is electrically connected to the drain of the transistor T, and one end of the resistor Re2 (third end) is electrically connected to the source of the transistor T. The other end of the resistor Re1 (second end) is electrically connected to the other end of the resistor Re2 (fourth end). The resistor Re1 may have a resistance value equal to a resistance value of the resistor Re2. The node between the resistor Re1 and the resistor Re2 (center node) generates the reference potential of the resistance control voltage.

The resistor Rcnt is electrically connected between the center node and the variable current source Scnt, further, between the center node and the resistor Rg. The Resistor element Rg is electrically connected between the gate of the transistor T and a connection node of the variable current source Scnt and the resistor Rcnt. The variable current source Scnt receives the gain control signal Vamp, and supplies a control current Icnt to the resistor Rcnt in accordance with the gain control signal Vamp. The resistance control voltage is generated by the voltage drop of the resistor Rcnt through which the control current Icnt flows. The resistance control voltage is applied to the gate of the transistor T through the resistor Rg with reference to the reference potential thereof generated at the center node. For example, since the transistor T is a MOSFET and the gate of the transistor T has large input impedance, a DC current hardly flows into the gate of the transistor T. Accordingly, no DC current flows though the resistor Rg and no voltage drop is generated at the resistor Rg. Therefore, the resistance control voltage generated by the resistor Rcnt is applied to the gate of the transistor T as it is. The resistance control voltage is applied through the resistor Rg to the gate of the transistor T with reference to the reference potential thereof generated at the center node.

Third, the configuration of the control circuit CNT3 shown in FIG. 4 is be described. The control circuit CNT3 differs from the control circuit CNT1 shown in FIG. 2 in that the resistor Rg of the control circuit CNT1 is removed. The control circuit CNT3 includes the resistor Re1, the resistor Re2, and the resistor Rcnt, the capacitor Ccnt, and the variable current source Scnt.

The resistor Re1 and the resistor Re2 are electrically connected in series with each other between the drain and the source of the transistor T. For example, one end of the resistor Re1 (first end) is electrically connected to the drain of the transistor T, and one end of the resistor Re2 (third end) is electrically connected to the source of the transistor T. The other end of the resistor Re1 (second end) is electrically connected to the other end of the resistor Re2 (fourth end). The resistor Re1 may have a resistance value equal to a resistance value of the resistor Re2. The node between the resistor Re1 and the resistor Re2 (center node) generates the reference potential of the resistance control voltage.

The resistor Rcnt and the capacitor Ccnt are electrically connected in parallel to each other, between the center node and the variable current source Scnt, further, between the center node and the gate of the transistor T. The gate of transistor T is electrically connected to the connection node of the variable current source Scnt, the resistor Rcnt, and the capacitor Ccnt.

The variable current source Scnt receives the gain control signal Vamp, and supplies a control current Icnt to the resistor Rcnt in accordance with the gain control signal Vamp. The resistance control voltage is generated by the voltage drop of the resistor Rcnt through which the control current Icnt flows. The resistance control voltage is applied to the gate of the transistor T with reference to the reference potential thereof generated at the center node.

Fourth, the configuration of the control circuit CNT4 shown in FIG. 5 is described. The control circuit CNT4 differs from the control circuit CNT1 shown in FIG. 2 in that the capacitor Ccnt and the resistor element Rg of the control circuit CNT1 are removed. The control circuit CNT4 includes the resistor Re1, the resistor Re2, and the resistor Rcnt, and the variable current source Scnt.

The resistor Re1 and the resistor Re2 are electrically connected in series with each other between the drain and the source of the transistor T. For example, one end of the resistor Re1 (first end) is electrically connected to the drain of the transistor T, and one end of the resistor Re2 (third end) is electrically connected to the source of the transistor T. The other end of the resistor Re1 (second end) is electrically connected to the other end of the resistor Re2 (fourth end). The resistor Re1 may have a resistance value equal to a resistance value of the resistor Re2. The node between the resistor Re1 and the resistor Re2 (center node) generates the reference potential of the resistance control voltage.

The resistor Rcnt is electrically connected between the center node and the variable current source Scnt, further, between the center node and the gate of the transistor T. The gate of transistor T is electrically connected to the connection node of the variable current source Scnt, the resistor Rcnt. The variable current source Scnt receives the gain control signal Vamp, and supplies a control current Icnt to the resistor Rcnt in accordance with the gain control signal Vamp. The resistance control voltage is generated by the voltage drop of the resistor Rcnt through which the control current Icnt flows. The resistance control voltage is applied to the gate of the transistor T with reference to the reference potential thereof generated at the center node.

Fifth, the configuration of the control circuit CNT5 shown in FIG. 6 is described. The control circuit CNT5 differs from the control circuit CNT1 shown in FIG. 2 in that the connection node of the capacitor Ccnt is changed from the control circuit CNT1. The control circuit CNT5 includes the resistor Re1, the resistor Re2, the resistor Rcnt, the resistor Rg, the capacitor Ccnt, and the variable current source Scnt.

The resistor Re1 and the resistor Re2 are electrically connected in series with each other between the drain and the source of the transistor T. For example, one end of the resistor Re1 (first end) is electrically connected to the drain of the transistor T, and one end of the resistor Re2 (third end) is electrically connected to the source of the transistor T. The other end of the resistor Re1 (second end) is electrically connected to the other end of the resistor Re2 (fourth end). The resistor Re1 may have a resistance value equal to a resistance value of the resistor Re2. The node between the resistor Re1 and the resistor Re2 (center node) generates the reference potential of the resistance control voltage.

The resistor Rcnt is electrically connected between the center node and the variable current source Scnt, further, between the center node and the resistor Rg. The Resistor element Rg is electrically connected between the gate of the transistor T and the connection node of the variable current source Scnt and the resistor Rcnt. The variable current source Scnt receives the gain control signal Vamp, and supplies a control current Icnt to the resistor Rcnt in accordance with the gain control signal Vamp. The resistance control voltage is generated by the voltage drop of the resistor Rcnt through which the control current Icnt flows. The resistance control voltage is applied to the gate of the transistor T through the resistor Rg with reference to the reference potential thereof generated at the center node. For example, since the transistor T is a MOSFET and the gate of the transistor T has large input impedance, a DC current hardly flows into the gate of the transistor T. Accordingly, no DC current flows though the resistor Rg and no voltage drop is generated at the resistor Rg. Therefore, the resistance control voltage generated by the resistor Rcnt is applied to the gate of the transistor T as it is. The resistance control voltage is applied through the resistor Rg to the gate of the transistor T with reference to the reference potential thereof generated at the center node.

The capacitor Ccnt is electrically connected between the gate of the transistor T and the center node.

Figure 7:
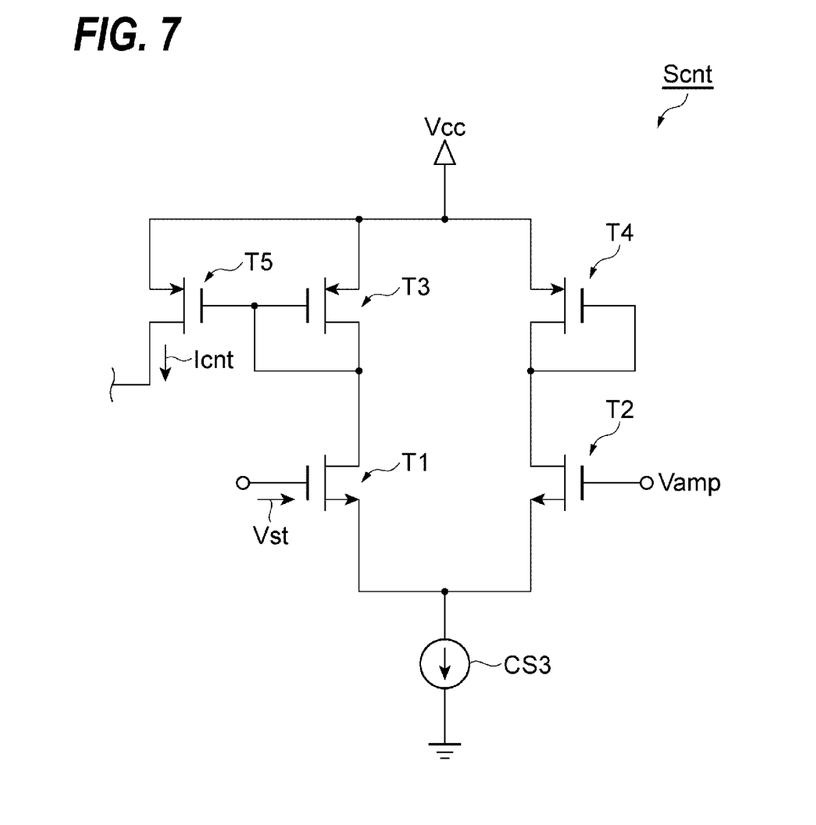
FIG. 7 is a diagram illustrating a specific configuration of the variable current source of the control circuit shown in each of FIGS. 2 to 6.

Referring to FIG. 7, a configuration of the variable current source Scnt shown in FIGS. 2 to 6 is described. The variable current source Scnt varies a current value of the current supplied to the resistor Rcnt in accordance with the gain control signal Vamp. For example, when the amplitude of the input signal Vin or the differential output signal Vdiff increases, the variable current source Scnt decreases the current value, and when the amplitude of the input signal Vin or the differential output signal Vdiff decreases, the variable current source Scnt increases the current value.

The variable current source Scnt includes a transistor T1 (first FET), a transistor T2 (second FET). The variable current source Scnt further includes, for example, a transistor T3 (third FET), a transistor T4 (fourth FET), and a transistor T5 (fifth FET). The variable current source Scnt further comprises a current source CS3 (third current source).

The transistors T1 and T2 may be, for example, N-type MOS transistors. The transistor T1 preferably has electrical characteristics equal to electrical characteristics of the transistor T2, so that the transistor T1 and the transistor T2 constitute a differential transistor pair. The transistor T3, the transistor T4, and the transistor T5 may be, for example, P-type MOS transistors. The transistors T3 preferably has electrical characteristics equal to electrical characteristics of the transistor T4, so that the transistors T3 and the transistors T4 constitute a pair of load elements.

The gate of the transistor T1 receives a static potential Vst (static voltage signal) supplied from the outside of the variable current source Scnt. The static potential Vst may be externally supplied or generated within the variable current source Scnt. The gate of the transistor T2 receives the gain control signal Vamp. Each source of the transistor T1 and the transistor T2 is electrically connected to the current source CS3. The current source CS3 supplies a constant current to the transistors T1, T2.

The respective drains of the transistor T3 and the transistor T1 are electrically connected to each other. The respective drains of the transistor T4 and the transistor T2 are electrically connected to each other. Each source of the transistor T3, the transistor T4, and the transistor T5 is electrically connected to a power supply Vcc. The power supply Vcc supplies, for example, a supply voltage larger than a voltage required for transistor operation (e.g., drain-source voltage) to the transistor T3, the transistor T4, and the transistor T5.

The transistors T1, T2, T3, T4, and the current source CS3 constitute a differential amplifier. The current supplied by the current source CS3 is divided between the transistor T1 and the transistor T2 in accordance with a difference in voltage between the gain control signal Vamp and the static potential Vst. For example, when the potential of the gain control signal Vamp is larger than the static potential Vst, the current flowing through the transistors T2 and T4 becomes larger than the current flowing through the transistors T1 and T3. As the current flowing the transistor T3 is reduced, the control current Icnt output from the transistor T5 is decreased. Reversely, when the potential of the gain control signal Vamp is smaller than the static potential Vst, the current flowing through the transistors T1 and T3 becomes larger than the current flowing through the transistors T2 and T4. As the current flowing through the transistor T3 is increased, the control current Icnt output from the transistor T5 is increased. Therefore, when voltage of the gain control signal Vamp increases, the control current Icnt decreases, and when the voltage of the gain control signal Vamp decreases, the gain control current Icnt increases.

The gate of the transistor T3 is electrically connected to the drain of the transistor T3. The gate of the transistor T4 is electrically connected to the drain of the transistor T4. The gate of the transistor T3 is further electrically connected to the gate of the transistor T5. The transistor T3 and the transistor T5 constitute a current mirror circuit. The drain of the transistor T5 outputs the control current Icnt as an output of the variable current source Scnt. The output of the variable current source Scnt, for example, is electrically connected through the resistor Rcnt to the center node electrically connected between the resistor Re1 and the resistor Re2 in the control circuit CNT.

As described above, the resistance control voltage is generated by the voltage drop of the resistor element Rcnt through which the gain control current Icnt flows. The resistance control voltage is applied to the gate of the transistor T with reference to the reference potential generated at the center node. For example, according to the variable current source Scnt illustrated in FIG. 7, when the gain control signal Vamp is increased, the on-resistance of the transistor T increases, as the increase of the gain control signal Vamp decreases the control current Icnt and the resistance control voltage becomes smaller. Thus the gain of the differential amplifier circuit 1 is decreased. Further, when the gain control signal Vamp is decreased, the on-resistance of the transistor T is decreased, as the decrease of the gain control signal Vamp increases the control current Icnt and the resistance control voltage becomes larger. Thus the gain of the differential amplifier circuit 1 is increased. For example, a control which increases the gain control signal Vamp against an increase in the amplitude of the input signal Vin or the differential output signal Vdiff allows the gain of the differential amplifier circuit 1 to be reduced. Also, a control that decreases the gain control signal Vamp against a decrease in the amplitude of the input signal Vin or the differential output signal Vdiff allows the gain of the differential amplifier circuit 1 to be increased. Therefore, an automatic gain control (AGC) can be configured to keep the amplitude of the differential output signal Vdiff at a constant value by increasing the gain control signal Vamp against the increase in the amplitude and decreasing the gain control signal Vamp against the decrease in the amplitude.

Figure 8:
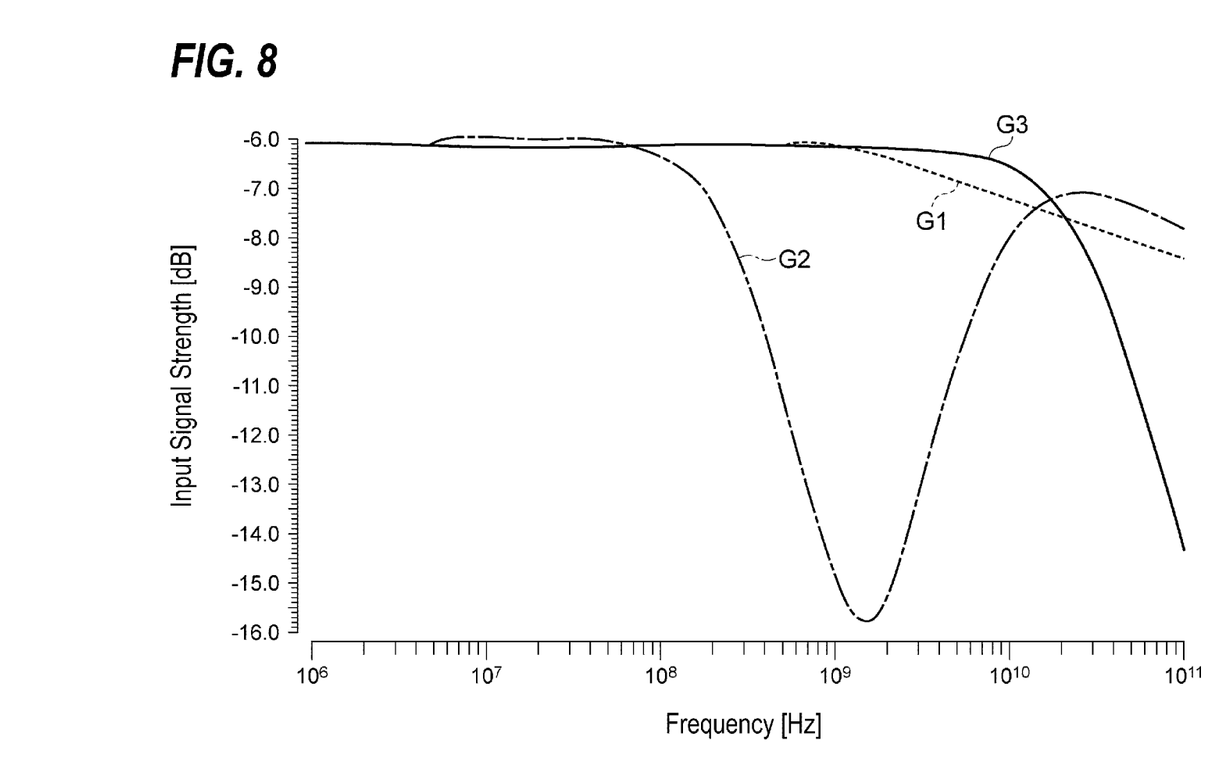
FIG. 8 is a diagram for explaining advantages of the differential amplifier circuit shown in each of FIGS. 1 to 6

Referring to FIG. 8, the operation of the differential amplifier circuit 1 is described for the respective cases that the control circuit CNT1 shown in FIG. 2, the control circuit CNT2 shown in FIG. 3, or the control circuit CNT3 shown in FIG. 4 is used as the control circuit CNT shown FIG. 1. The result shown in FIG. 8 is a result obtained with reference to strength (amplitude) of the input signal Vin. In FIG. 8, the horizontal axis represents frequency [Hz] of the input signal Vin, and the vertical axis represents the strength [dB] (amplitude) of the gate potential applied to the gate of the transistor T. As described above, when the input signal Vin changes, the reference potential of the resistance control voltage fluctuates, and accordingly also the gate potential of the transistor T fluctuates.

In FIG. 8, the curve G1 shows a result obtained when the control circuit CNT1 shown in FIG. 2 is used, and the curve G2 is a result obtained when the control circuit CNT2 shown in FIG. 3 is used. Then, the curve G3 is a result obtained when the control circuit CNT3 shown in FIG. 4 is used.

As shown in the curve G1, when the control circuit CNT1 shown in FIG. 2 is used, over a relatively wide frequency band (e.g., 10 [GHz] or more), the strength of the gate potential can be maintained at about −6 [dB]. Here, the strength −6 [dB] corresponds to approximately a half of the strength 0 [dB] of the input signal Vin, in a linear scale. The amplitude of the fluctuation in the reference potential of the resistance control voltage caused by periodic change in the input signal Vin becomes approximately a half of the amplitude of the input signal Vin. The gate potential fluctuates as well as the reference potential of the resistance control voltage, if the reference potential of the gate potential is set to the ground. Therefore, when the control circuit CNT1 shown in FIG. 2 is used, the reference potential of the resistance control voltage is kept at an average value of the drain potential and the source potential of the transistor T, and the amplitude of the gate-source voltage of the transistor T can be equal to the amplitude of the gate-drain voltage of the transistor T. Such condition allows the on-resistance of the transistor T to be maintained stable at a resistance value adjusted by the resistance control voltage, over the relatively wide frequency band. Thus, the distortion of the differential output signal Vdiff due to instability of the on-resistance of the transistor T is reduced, and the linearity of the differential output signal Vdiff with respect to the input signal Vin can be improved.

Further, as shown in the curve G2, when the control circuit CNT2 shown in FIG. 3 is used, in the frequency band of 0.1 [GHz] or less, and in the frequency band of 10 [GHz] or more, the strength of the gate potential can be maintained at about −6 [dB]. Here, the strength −6 [dB] corresponds to approximately a half of the strength 0 [dB] of the input signal Vin, in a linear scale. Therefore, when the control circuit CNT2 shown in FIG. 3 is used, for example, when the fundamental frequency of the input signal Vin is limited in the frequency band of 0.1 [GHz] or less, or is limited in the frequency band of 10 [GHz] or more, the distortion of the differential output signal Vdiff is reduced, and the linearity of the differential output signal Vdiff with respect to the input signal Vin can be improved.

The difference in the frequency characteristics between the curve G1 and the curve G2 comes from a parasitic capacitance caused by the resistor Rcnt electrically connected to the center node between the resistor Re1 and the resistor Re2. For example, when the resistance value of the resistor Rcnt is 5 [KΩ], the resistor Rcnt electrically connected to the center node between the resistor Re1 and the resistor Re2 may cause a parasitic capacitance Cp with capacitance value approximately 1 [pF] at the center node. When the frequency of the input signal Vin is increased, charging and discharging the parasitic capacitance Cp may deteriorate response of the gate potential of the transistor T to periodic change in the input signal Vin, and labilize the resistance control voltage and the on-resistance of the transistor T adjusted by the resistance control voltage. The curve G2 shows that such degradation occurs above 0.1 GHz. The curve G2 becomes larger again over 1.5 [GHz], because the changes of the drain potential and source potential are transmitted to the gate of the transistor T through the gate-drain capacitance Cgd and the gate-source capacitance Cgs of transistor T, respectively, and the affection of the parasitic capacitance Cp can be suppressed. In the control circuit CNT1, the capacitor Ccnt is connected in parallel to the resistor Rcnt. The change in the reference potential of the resistance control voltage is transmitted through the capacitor Ccnt to the gate potential of the transistor T, so that the resistance control voltage and the on-resistance of the transistor T adjusted by the resistance control voltage can be kept stable up to 10 [GHz] or more.

Further, as shown in curve G3, when the control circuit CNT3 shown in FIG. 4 is used, in the frequency band of 10 [GHz] or less, the strength of the gate potential can be maintained at about −6 [dB]. Here, the strength −6 [dB] corresponds to approximately a half of the strength 0 [dB] of the input signal Vin, in a linear scale. Therefore, when the control circuit CNT3 shown in FIG. 4 is used, in the frequency band of 10 [GHz] or less, the distortion of the differential output signal Vdiff is reduced, and the linearity of the differential output signal Vdiff with respect to the input signal Vin can be improved.

Incidentally, the curve G3 shows that the strength (amplitude) of the gate potential rapidly decreases, when the frequency exceeds 20 [GHz]. This is because, the control circuit CNT3 transmits the changes of the drain potential and the source potential of the transistor T to the gate of the transistor T through the gate-drain capacitance Cgd and the gate-source capacitance Cgs in the frequency lower than 20 [GHz] as well as the CNT2, although a leakage current flows toward the ground through the parasitic capacitor Cp in the frequency larger than 20 [GHz] and suppress the transmitted changes in the gate potential. In the control circuit CNT1, the resistor Rg electrically connected between the gate of the transistor T and the connection node of the variable current source Scnt, the resistor Rcnt, and the capacitor Ccnt, can suppress the leakage current and the abrupt reduction in the amplitude of the gate potential in the frequency larger than 10 [GHz]. For example, when the frequency of the input signal Vin is less than 10 [GHz], the resistor Rg may be omitted as in the control circuit CNT3, and when the frequency of the input signal Vin exceeds 10 [GHz], the control circuit CNT preferably has the resistor Rg like the control circuit CNT1.

When the control circuit CNT4 shown in FIG. 5 is used, the capacitor Ccnt and the resistor element Rg described above are removed from the control circuit CNT1. In the control circuit CNT4, the gate of the transitor T is directly connected to the connection node between the variable current source Scnt and the resistor Rcnt. For example, when the fundamental frequency of the input signal Vin is limited in the frequency band of 0.1 [GHz] or less, the distortion of the differential output signal Vdiff is reduced, and the linearity of the differential output signal Vdiff with respect to the input signal Vin can be improved. In this case, the resistor Rg which works at a frequency of 10 [GHz] or more can be omitted in comparison with the control circuit CNT2.

When the control circuit CNT5 shown in FIG. 6 is used, without passing through the resistor Rg, the center node between the resistor Re1 and the resistor Re2 is electrically coupled to the gate of the transistor T by the capacitor Ccnt. Thus, the change in the reference potential of the resistance control voltage can be directly transmitted to the gate potential, it can be expected that the resistance control voltage is maintained at a constant value and the linearity of the differential output signal Vdiff with respect to the input signal Vin can be improved, up to a frequency similar to or higher than the control circuit CNT1.

While various exemplary embodiments have been described above, various omissions, substitutions, and changes may be made without being limited to the exemplary embodiments described above. It is also possible to combine elements in different embodiments to form other embodiments.

From the foregoing description, it will be appreciated that various embodiments of the present disclosure have been described herein for purposes of description and that various changes may be made without departing from the scope and spirit of the disclosure. Accordingly, the various embodiments disclosed herein are not intended to be limiting, with a true scope and spirit being indicated by the appended claims.

What is claimed is:
1. A differential amplifier circuit comprising:
   a first transistor having a first control terminal, a first inflow terminal, and a first outflow terminal, the first control terminal receiving an input signal, the first inflow terminal outputting a first output signal;
   a second transistor having a second control terminal, a second inflow terminal, and a second outflow terminal, the second control terminal receiving a reference signal, the second inflow terminal outputting a second output signal;
   a field effect transistor (FET) having a center terminal, a first terminal having a first potential, and a second terminal having a second potential, the second terminal being electrically connected to the first outflow terminal, the first terminal being electrically connected to the second outflow terminal;
   a first current source electrically connected to the first outflow terminal;

a second current source electrically connected to the second outflow terminal; and a control circuit including:

a first resistor having a first end and a second end, the first end being electrically connected to the second terminal of the FET;

a second resistor having a third end and a fourth end, the third end being electrically connected to the first terminal of the FET;

a center node electrically connected to the second end of the first resistor and the fourth end of the second resistor, the center node providing a reference potential;

a variable current source configured to supply a control current in accordance with a gain control signal; and a third resistor electrically connected between the variable current source and the center node, the third resistor being configured to generate a voltage drop with reference to the reference potential by receiving the control current, wherein the first resistor has a resistance value equal to a resistance value of the second resistor, wherein the reference potential has an average value of the first potential and the second potential, and wherein the center terminal of the FET is electrically connected to a connection node between the third resistor and the variable current source.

2. The differential amplifier circuit according to claim 1, wherein the control circuit further includes a capacitor connected in parallel with the third resistor.

3. The differential amplifier circuit according to claim 2, wherein the control circuit further includes a fourth resistor connected between the gate of the FET and a parallel circuit of the third resistor and the capacitor.

4. The differential amplifier circuit according to claim 1, wherein the control circuit further includes a fourth resistor connected between the center terminal of the FET and the connection node between the third resistor and the variable current source.

5. The differential amplifier circuit according to claim 4, wherein the control circuit further includes a capacitor connected between the center terminal of the FET and the center node.

6. The differential amplifier circuit according to claim 1, wherein the first current source supplies a first current, the second current source supplies a second current, and the first current is set to a current value equal to a current value of the second current.

7. The differential amplifier circuit according to claim 6, wherein the first transistor is formed to have electrical characteristics equal to electrical characteristics of the second transistor.

8. The differential amplifier circuit according to claim 1, wherein the variable current source includes:

a first FET having a gate receiving a static voltage signal, a drain, and a source;

a second FET having a gate receiving the gain control signal, a drain, and a source;

another current source electrically connected to the source of the first FET and the source of the second FET;

a third FET having a gate, a drain, and a source, the gate of the third FET being electrically connected to the drain of the third FET, the drain of the third FET being electrically connected to the drain of the first FET;

a fourth FET having a gate, a drain, a source, the gate of the fourth FET being electrically connected to the drain of the fourth FET, the drain of the fourth FET being electrically connected to the drain of the second FET; and a fifth FET having a gate, a drain, and a source, the gate of the fifth FET being electrically connected to the gate of the third FET, the source of the fifth FET being electrically connected to the source of the third FET and the source of the fourth FET, the drain of the fifth FET outputting the control current.

9. A differential amplifier circuit comprising:

a first transistor having a first control terminal, a first inflow terminal, and a first outflow terminal, the first control terminal receiving an input signal, the first inflow terminal outputting a first output signal;

a second transistor having a second control terminal, a second inflow terminal, and a second outflow terminal, the second control terminal receiving a reference signal, the second inflow terminal outputting a second output signal;

a field effect transistor (FET) having a center terminal, a first terminal, and a second terminal, the second terminal being electrically connected to the first outflow terminal, the first terminal being electrically connected to the second outflow terminal;

a first current source electrically connected to the first outflow terminal;

a second current source electrically connected to the second outflow terminal; and a control circuit including:

a first resistor having a first end and a second end, the first end being electrically connected to the second terminal of the FET;

a second resistor having a third end and a fourth end, the third end being electrically connected to the first terminal of the FET;

a center node electrically connected to the second end of the first resistor and the fourth end of the second resistor;

a third resistor electrically connected between the center terminal of the FET and the center node; and a variable current source configured to supply a control current to the third resistor in accordance with a gain control signal, wherein the first resistor has a resistance value equal to a resistance value of the second resistor, and wherein the control circuit further includes a capacitor connected in parallel with the third resistor.

10. The differential amplifier circuit according to claim 9, wherein the control circuit further includes a fourth resistor connected between the gate of the FET and a parallel circuit of the third resistor and the capacitor.

11. A differential amplifier circuit comprising:

a first transistor having a first control terminal, a first inflow terminal, and a first outflow terminal, the first control terminal receiving an input signal, the first inflow terminal outputting a first output signal;

a second transistor having a second control terminal, a second inflow terminal, and a second outflow terminal, the second control terminal receiving a reference signal, the second inflow terminal outputting a second output signal;

a field effect transistor (FET) having a center terminal, a first terminal, and a second terminal, the second terminal being electrically connected to the first outflow terminal, the first terminal being electrically connected to the second outflow terminal;
a first current source electrically connected to the first outflow terminal;
a second current source electrically connected to the second outflow terminal; and
a control circuit including:
   a first resistor having a first end and a second end, the first end being electrically connected to the second terminal of the FET;
   a second resistor having a third end and a fourth end, the third end being electrically connected to the first terminal of the FET;
   a center node electrically connected to the second end of the first resistor and the fourth end of the second resistor;
   a third resistor electrically connected between the center terminal of the FET and the center node; and
   a variable current source configured to supply a control current to the third resistor in accordance with a gain control signal,
wherein the first resistor has a resistance value equal to a resistance value of the second resistor, and
wherein the variable current source includes:
a first FET having a gate receiving a static voltage signal, a drain, and a source;
a second FET having a gate receiving the gain control signal, a drain, and a source;
another current source electrically connected to the source of the first FET and the source of the second FET;
a third FET having a gate, a drain, and a source, the gate of the third FET being electrically connected to the drain of the third FET, the drain of the third FET being electrically connected to the drain of the first FET;
a fourth FET having a gate, a drain, a source, the gate of the fourth FET being electrically connected to the drain of the fourth FET, the drain of the fourth FET being electrically connected to the drain of the second FET; and
a fifth FET having a gate, a drain, and a source, the gate of the fifth FET being electrically connected to the gate of the third FET, the source of the fifth FET being electrically connected to the source of the third FET and the source of the fourth FET, the drain of the fifth FET outputting the control current.

* * * * *